US006285255B1

(12) United States Patent
Luu et al.

(10) Patent No.: US 6,285,255 B1
(45) Date of Patent: Sep. 4, 2001

(54) ADAPTIVE COMPENSATION FOR CARRIER SIGNAL PHASE DISTORTION

(75) Inventors: Ky Thoai Luu, Quincy, IL (US); Wayne Douglas Duello, Hamilton; Douglas J. Posey, Centerville, both of OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/545,319

(22) Filed: Apr. 7, 2000

Related U.S. Application Data

(63) Continuation-in-part of application No. 09/431,811, filed on Nov. 2, 1999.

(51) Int. Cl.[7] ........................................ H03F 1/26
(52) U.S. Cl. ......................... 330/149; 330/10; 332/162; 375/297; 455/126
(58) Field of Search ........................... 330/10, 107, 149; 332/160, 161, 162, 149, 150; 375/96, 97; 455/108, 126

(56) References Cited

U.S. PATENT DOCUMENTS

| 4,600,892 | * | 7/1986 | Wagner et al. | 330/144 |
|---|---|---|---|---|
| 4,952,890 | | 8/1990 | Swanson | 332/152 |
| 5,049,832 | * | 9/1991 | Cavers | 330/149 |
| 5,121,077 | * | 6/1992 | McGann | 330/149 |
| 5,132,637 | | 7/1992 | Swanson | 330/10 |
| 5,247,542 | * | 9/1993 | Onodera et al. | 375/60 |
| 5,798,674 | * | 8/1998 | Fountain | 332/149 |

* cited by examiner

Primary Examiner—Robert Pascal
Assistant Examiner—Henry Choe
(74) Attorney, Agent, or Firm—Tarolli, Sundheim, Covell, Tummino & Szabo L.L.P.

(57) ABSTRACT

Apparatus and method are presented for adaptively compensating for carrier signal phase distortion caused by amplitude modulating an RF carrier signal. A modulator-amplifier network receives an RF carrier signal and modulates it by a received amplitude varying signal to obtain therefrom a modulated RF carrier signal which is phase shifted from the phase of the carrier signal applied to the network by an amount that varies with the value of the amplitude varying signal. A phase shifter receives the RF carrier signal and phase shifts it in accordance with the value of a received phase correction signal to provide a pre-phase shifted carrier signal that is applied to the modulator-amplifier network. A phase detector receives and compares the modulated RF carrier signal and the carrier signal and provides an error signal in accordance with the comparison. An adaptive controller provides the correction signal and receives the error signal and the amplitude varying signal and varies the value of the correction signal in accordance with the value of the error signal and the value of the amplitude varying signal.

11 Claims, 3 Drawing Sheets

US 6,285,255 B1

ADAPTIVE COMPENSATION FOR CARRIER SIGNAL PHASE DISTORTION

RELATED APPLICATION

This is a continuation-in-part of my co-pending U.S. patent application Ser. No. 09/431,811 which was filed on Nov. 2, 1999.

BACKGROUND OF THE INVENTION

1. Technical Field

This invention relates to the art of AM radio broadcasting and, more particularly, to providing adaptive compensation for carrier signal phase distortion caused by amplitude modulation of a RF carrier signal.

2. Description of the Prior Art

The U.S. patents to H. I. Swanson U.S. Pat. Nos. 4,952,890 and 5,132,637 disclose amplitude modulators for use in AM radio broadcasting wherein the modulator serves to generate an amplitude modulated signal by selectively turning on and off a plurality of RF amplifiers to produce amplitude modulation. Each of the RF amplifiers includes a plurality of switching transistors, each of which may take the form of a MOSFET transistor, connected together in a bridge circuit. It is known that amplitude modulating an RF carrier signal with an amplitude varying signal will result in the output carrier signal being shifted in phase from that of the input carrier signal by an amount that varies with the magnitude of the amplitude varying signal. This carrier phase error or distortion in the modulators results in part because the turn on and turn off delays are not constant as the gain of the amplifier is changing. This problem becomes particularly significant where such transmitters are required to pass a phase modulated signal such as stereo CQAM or digital in-band on channel (IBOC) digital radio signals.

In the prior art as illustrated herein in FIG. 1, it is known to provide some compensation for such phase distortion by pre-distorting the input. This is not an adaptive system and phase correction using this approach is limited and is load dependent. The aforesaid patent to Swanson U.S. Pat. No. 4,952,890 provides forward phase correction similar to that of FIG. 1 herein. Also, the aforementioned patent to Swanson U.S. Pat. No. 5,132,637, while employing adaptive feedback circuitry for correcting for distortions due to power supply variations, does not respond to the amplitude of the input audio signal for adaptively correcting for carrier phase distortions due to amplitude modulation of the carrier signal.

The U.S. patent to McGann U.S. Pat. No. 5,121,077 discloses an RF power amplifier wherein a sample of the output is compared with a sample of the RF drive signal with a phase detector which, in turn, drives a phase shifter to shift the phase of the signal applied to the power amplifier. However, there is no teaching of providing a correction signal to the phase shifter based on the magnitude of an amplitude varying input signal.

SUMMARY OF THE INVENTION

In accordance with the present invention, a circuit is provided for adaptively compensating for carrier signal phase distortion caused by amplitude modulating an RF carrier signal. The circuit includes a modulator-amplifier network that receives an RF carrier signal and modulates it by a received amplitude varying signal to obtain therefrom an output modulated RF carrier signal that is phase shifted from the phase of the carrier signal applied to the network and wherein the amount of phase shift is a function of the value of the received amplitude varying signal A phase shifter receives an RF carrier signal and phase shifts it in accordance with the value of a received phase correction signal to provide a pre-phase shifted carrier signal that is applied to the modulator-amplitude network that provides the output modulated RF carrier signal. A phase detector receives and compares the output modulated RF carrier signal and the carrier signal and provides an error signal in accordance with the comparison. An adaptive controller provides the correction signal and it receives the error signal as well as the amplitude varying signal and varies the value of the correction signal in accordance with the values of the error signal and the amplitude varying signal.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENTS

Figure 1:
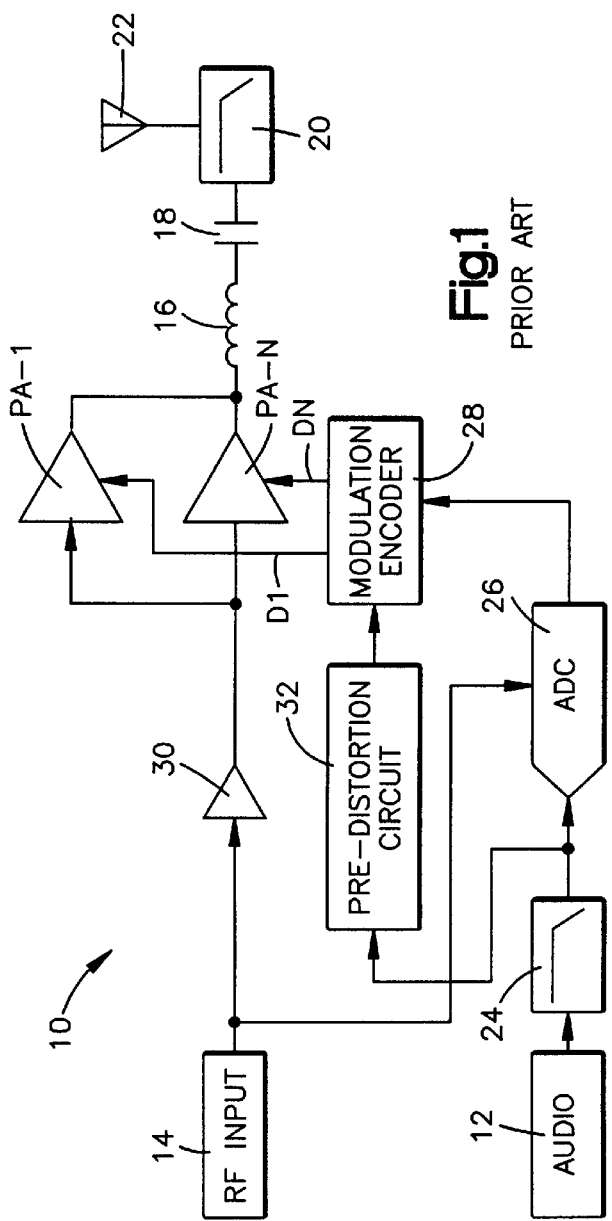
FIG. 1 is a schematic-block diagram illustration representing a prior art circuit.

Before describing the preferred embodiments of the invention reference is first made to the prior art circuit illustrated in FIG. 1. This is a digital amplitude modulator similar to that illustrated and described in the aforesaid U.S. Swanson patents. The amplitude modulator 10 is illustrated as receiving an input signal from an input signal source 12, taking the form of an audio signal source. Another input to the modulator is an RF carrier signal obtained from an RF input source 14. The modulator amplitude modulates the RF carrier signal with the amplitude varying audio signal to provide at its output a modulated RF carrier signal which is then applied to an output network including an inductor 16 and a capacitor 18 and, thence, through a filter 20 to a load 22, taking the form of an antenna.

Figure 2:
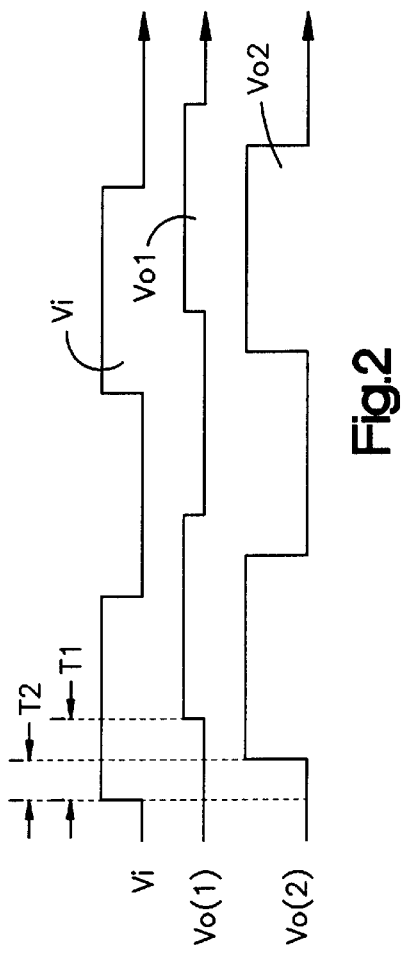
FIG. 2 is a graphical illustration of various waveforms illustrating a carrier wave and phase shifted carrier waves resulting from amplitude modulation which will be described herein to facilitate an understanding of the invention herein.

The amplitude varying audio signal is applied through a low pass filter 24 and is then converted into digital signals by an analog-to-digital converter 26 which is clocked at the frequency $F_c$ of the carrier signal. The digital words obtained from the analog-to-digital converter 26 represent the amplitude values of samples of the audio signal and these are supplied to a modulation encoder 28 which then raises one or more of its output lines D1–DN to turn on one or more of a group of power amplifiers PA-1 through PA-N in accordance with the value of the audio signal. The RF carrier signal supplied by the input source 14 is applied through a buffer 30 and thence to each of the power amplifiers PA-1 through PA-N, it being understood that only the power amplifiers PA-1 through PA-N that are turned on will amplify the carrier signal. The output signals of the power amplifiers are combined to provide a modulated RF carrier signal which is then supplied to the antenna 22. This output modulated carrier signal exhibits the same frequency as the carrier signal supplied by the source 14. However, the modulated RF carrier signal is phase shifted from the phase of the carrier signal applied to the power amplifiers by an amount that varies with the value of the amplitude varying signal supplied to the modulation encoder. This phase shift can be best understood with references to FIG. 2. FIG. 2 illustrates a squarewave carrier wave signal $V_i$ which is applied to the power amplifiers. This signal is made up of a plurality of squarewave pulses of constant magnitude and width and of a constant carrier frequency of $F_c$. Waveform $V_{o1}$ represents an output amplitude modulated carrier frequency signal that has been shifted in phase so that it lags the applied carrier signal $V_i$ by a time delay T1. It is to be noted the amplitude of signal $V_{o1}$ is smaller than carrier signal $V_{o2}$. Carrier signal $V_{o2}$ lags carrier signal $V_i$ by a time delay $T_2$. Thus, the phase shift is not constant but varies with the amplitude of the amplitude varying audio signal. Consequently, this variable phase shift represents distortion which is of particular concern when the transmitter is intended to pass a phase modulated signal such as stereo CQAM or digital-in-band on channel (IBOC) digital radio signals.

In accordance with the present invention, there is provided an adaptive approach to compensate for this variable phase shifting introduced by amplitude modulation. This adaptive approach provides a constant phase shift regardless of the envelope or modulation level and is continuously adaptive to provide the best phase error correction.

Figure 3:
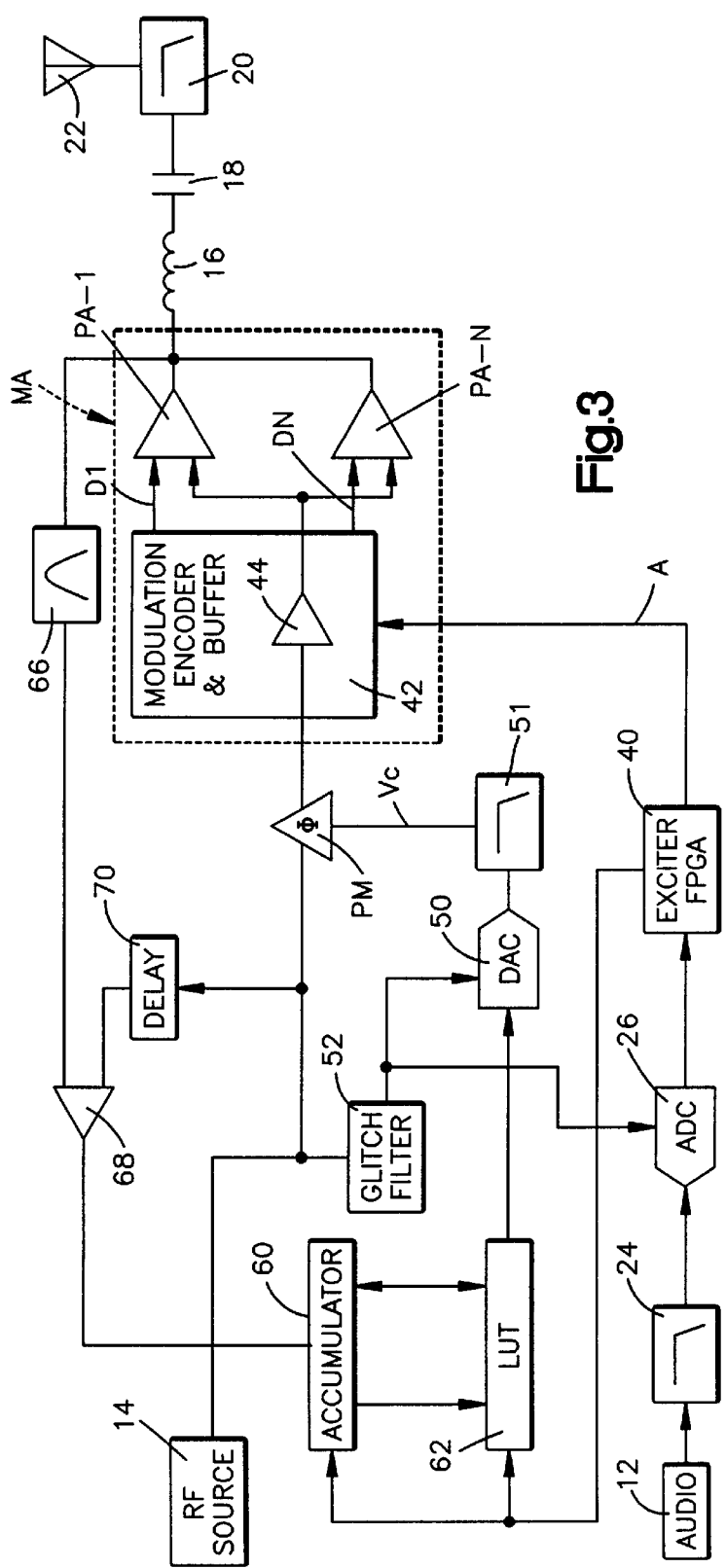
FIG. 3 is a schematic-block diagram illustration of one embodiment of the invention herein.

Reference is now made to FIG. 3 which illustrates one embodiment of the present invention. Like components in FIGS. 1 and 3 are identified with like characters and only the differences in components in FIGS. 1 and 3 will be described in detail hereinbelow. A modulator-amplifier network MA receives RF carrier signals by way of a phase modulator PM, to be described in greater detail hereinafter, from a source of RF signals 14. The modulator-amplifier network MA also receives an audio signal A from an audio source 12 by way of filter 24, an analog-to-digital converter 26 and an exciter field programmable gate array (FPGA) 40. The FPGA 40 provides a digital audio signal A to a modulation encoder and buffer 42 wherein the encoder portion provides a high or turn on signal on one or more of its output lines D1-DN to turn on one or more of the power amplifiers PA-1 through PA-N with the number being turned on being dependent on the value of the amplitude varying audio signal. The carrier signal $V_i$ is supplied through a buffer 44 to each of the power amplifiers PA-1 through P-N, it being understood that only the amplifiers that are turned on are effective to amplify the carrier signal.

Figure 4:
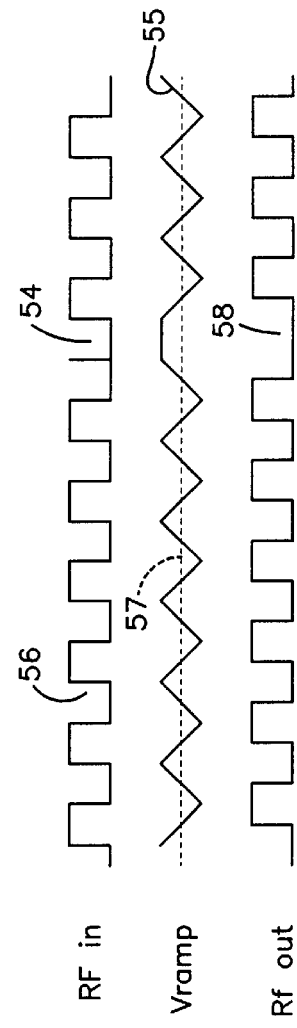
FIG. 4 is a graphical illustration showing waveforms illustrating the operation of a glitch filter employed in the embodiment of FIG. 3.

The audio signal is obtained from an audio source 12 and is applied to a low pass filter 24 prior to being digitized by a high speed analog-to-digital converter 26 which is clocked at the rate of the carrier frequency $F_c$. A digital-to-analog converter 50, to be described hereinafter, is also clocked at a rate corresponding with the carrier frequency. Both of these converters receive their clocking signals from a glitch filter 52 that is connected to the RF source 14. The glitch filter receives the input RF signal and removes any instantaneous phase reversal. Reference may be made to FIG. 4 which illustrates an RF input signal having a glitch at 54 in waveform 56. The filter includes an integrator circuit and a high speed comparator to reconstruct the RF output signal 58. The ramp signal is shown by the waveform 55 and the reference level for the high speed comparator by the dotted waveform 52.

The output of the analog-to-digital converter 26 is applied to an exciter FPGA (field programmable gate array) 40 which then supplies a digitized audio signal A to the modulation encoder portion of the modulation amplifier network MA. In addition, the exciter FPGA 40 applies a multi-bit (such as 14 bit) digital audio plus DC signal to an accumulator 60 and to a look up table (LUT) 62. A fixed delay is added to the audio plus DC signal to compensate for the audio pipeline delay stages in the exciter and modulation encoder processing. This signal is used to address the look up table 62 which provides + or $-N°$ of phase delay which is then used to drive a high speed digital-to-analog converter 50 to create an analog voltage proportional to the desired carrier phase shift. This is applied through filter 51 to provide a correction signal $V_C$ which is applied to a phase shifter (modulator) PM which shifts the phase of the carrier signal by the desired amount. This pre-shifted carrier signal is then supplied through buffer 44 to the power amplifiers PA-1 through PA-N.

A sample of the output voltage of the power amplifiers is feedback through a bandpass filter 66 to a phase detector 68 which also receives the output of the RF source 14. Thus the detector 68 compares the transmitted carrier signal with the input carrier signal. The phase error detector provides an output as a binary 1 signal or a binary 0 signal with 1 being representative of a phase lead and the other being representative of a phase lag. This information is then supplied to the accumulator 60. A phase lag signal indicates that the correction value at the address location in the look up table should be incremented whereas a phase lead signal indicates that the correction value should be decremented. By continuously "homing in" on the ideal compensation value the look up table will eventually reach a state wherein the values are changing by a least significant bit or the RMS error of the phase detector, whichever is greater. In this manner, the phase error is incrementally adjusted to nullify the error down to one bit of resolution.

Figure 5:
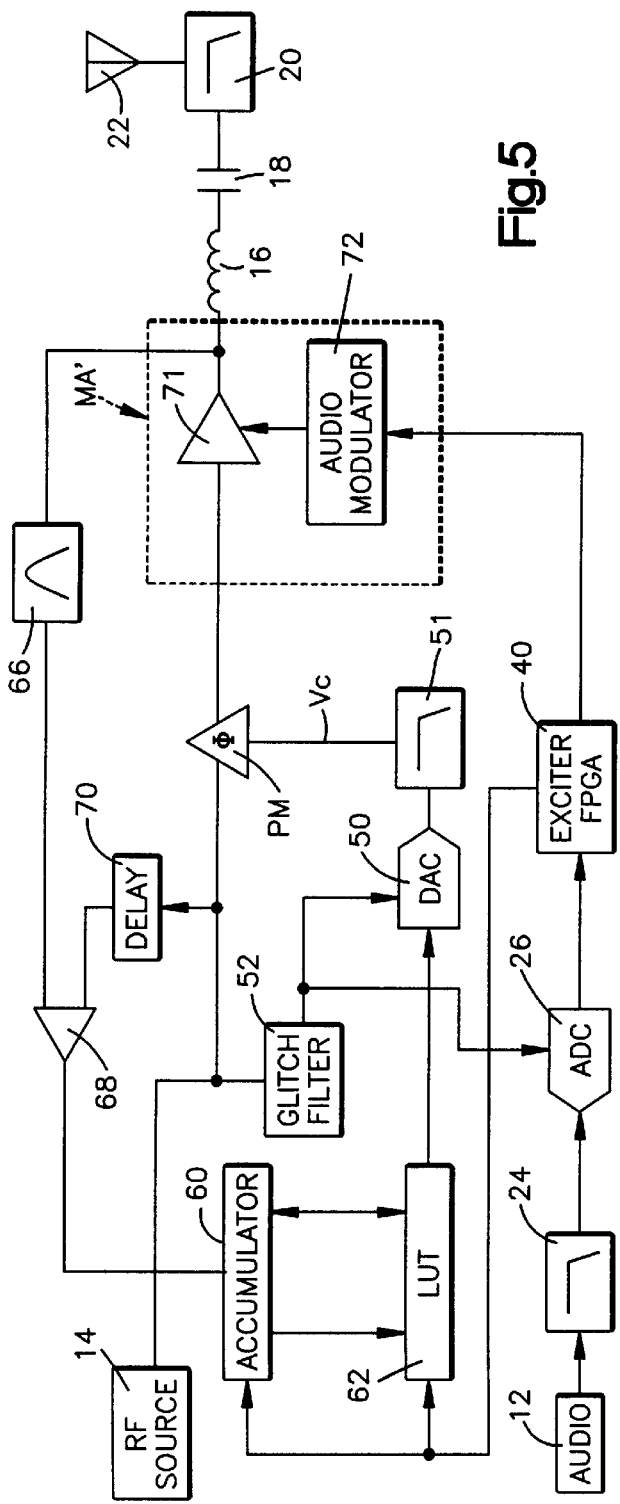
FIG. 5 is a schematic-block diagram illustration of a second embodiment of the invention herein; and, FIG. 6 is a schematic-block diagram illustration of a phase modulator which may be employed in the embodiments of FIGS. 3 and 5.

Reference is now made to the embodiment of FIG. 5. This embodiment is similar to that of the embodiment in FIG. 3 and consequently like components are identified with like character references and only the differences between the two figures will be described hereinbelow in detail. In the embodiment of FIG. 5 an alternative modulator-amplifier network $MA^1$ is provided which includes a single high power amplifier 71 whose gain is varied by an audio modulator 72 such that the gain of the amplifier varies with the magnitude of the audio signal. The amplitude modulated output carrier signal is supplied to the antenna 22. A sample of the amplitude modulated carrier signal is applied through the band pass filter 66 to the phase detector 68 in the same manner as in the embodiment of FIG. 3.

Figure 6:
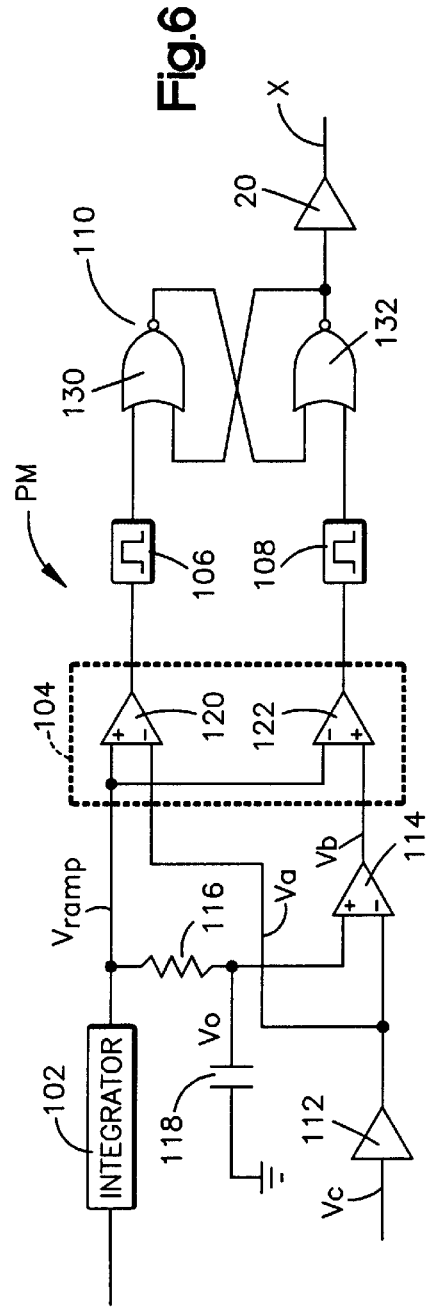

In the embodiments of FIGS. 3 and 5 a phase modulator (phase shifter) PM is employed which phase shifts the applied carrier signal by a desired amount in accordance with the magnitude of an analog control voltage $V_c$. Any suitable phase shifter may be employed that will perform this function. The phase shifter PM illustrated in FIG. 6 is briefly described below and a more detailed description is presented in my aforesaid patent application Ser. No. 09/431,811 filed Nov. 2, 1999.

This modulator includes a linear integrator 102, a dual slope comparator 104, a pair of pulse generators 106 and 108 and an S-R flip-flop 110. The phase shift is obtained proportional to the input phase shift control signal $V_c$.

Integrator 120 is a linear integrator that converts each pulse cycle of the RF signal into a dual slope symmetrical ramp signal. This ramp signal Vramp varies in magnitude from a minimum level to a maximum level and then back to the minimum level for each pulse cycle.

The control level signal $V_c$ is applied through an amplifier 112 to the negative or inverting input of an operational amplifier 114. The output from the integrator 102 is applied across a divider circuit including a resistor 116 and a capacitor 118 to ground. A reference voltage level is taken at the junction of the resistor 116 and capacitor 118 and this voltage is applied to the positive or non-inverting input of the operational amplifier 114. The output taken from amplifier 112, voltage $V_a$, is supplied to the negative or inverting input of an operational amplifier serving as a voltage comparator 120 in the dual slope comparator 104. The output voltage $V_b$ of operational amplifier 114 is supplied to the positive input of an operational amplifier taking the form of a voltage comparator 122 in the dual slope comparator 104. The ramp voltage obtained from the integrator 102 is supplied to the positive input of comparator 120 and to the negative input of comparator 122. The voltage $V_a$ obtained from amplifier 112 and the voltage $V_b$ obtained from amplifier 114 are equally spaced in opposite directions from the reference voltage $V_0$.

The dual slope comparator 104 compares the ramp voltage obtained from integrator 102 with the first and second level signals $V_a$ and $V_b$ and provides a first pulse signal and a second pulse signal. The first pulse signal has a time duration corresponding with the time duration that the ramp signal exceeds the first voltage $V_a$. The second pulse signal is provided for a time duration corresponding with the time duration that the second level signal $V_b$ exceeds the ramp signal.

The pulse generators 106 and 108 are respectively triggered by the leading edges of the positive output pulses taken from comparators 120 and 122 respectively. A bistable circuit taking the illustrative form of an S-R flip-flop 110 includes a pair of logic gates 130 and 132 connected as shown. The SET and RESET ports of flip-flop 110 respectively receive trigger pulses from the pulse generators 106 and 108 to change from one state to the other. The output signal X corresponds in duty cycle with the original RF input signal. The output signal X is shifted by a phase delay that is linearly proportional to the phase shift control signal $V_c$.

Although the foregoing has been described in conjunction with the preferred embodiments, it is to be appreciated that various modifications may be made without departing from the spirit and scope of the invention as defined by the appended claims.

Having described the invention, we claim:

1. A circuit for adaptively compensating for carrier signal phase distortion caused by amplitude modulating an RF carrier signal, comprising:
   a modulator-amplifier network for receiving an RF carrier signal and modulating it by a received amplitude varying signal to obtain therefrom a modulated RF carrier signal which is phase shifted from the phase of the carrier signal applied to said network by an amount that varies with the value of said amplitude varying signal;
   a phase shifter that receives an RF carrier signal and phase shifts it in accordance with the value of a received phase correction signal to provide a pre-phase shifted carrier signal that is applied to said modulator-amplifier network that provides said modulated RF carrier signal;
   a phase detector that receives and compares said modulated RF carrier signal and said carrier signal and provides an error signal in accordance with said comparison; and,
   an adaptive controller that provides said correction signal and which receives said error signal and said amplitude varying signal and varies the value of the correction signal in accordance with the value of said error signal and the value of said amplitude varying signal.

2. A circuit as set forth in claim 1 wherein said adaptive controller includes a look up table containing a plurality of correction factors at respectively corresponding addresses.

3. A circuit as set forth in claim 2 wherein said look up table is a multiple bit, addressable table for providing said correction factors as digital correction factors.

4. A circuit as set forth in claim 3 including a digital-to-analog converter synchronized to the frequency of said carrier signal for converting said digital correction factors to an analog signal serving as said phase correction signal.

5. A circuit as set forth in claim 4 including an analog-to-digital converter for converting said received amplitude varying signal to digital address signals having values that vary with the amplitude of said amplitude varying signal with said digital address signals being supplied to said addressable look up table to obtain therefrom said digital correction factors.

6. A circuit as set forth in claim 5 wherein said phase detector provides said error signal for each said address as a phase lead or phase lag indication dependent upon said comparison.

7. A circuit as set forth in claim 6 including apparatus for incrementally varying the correction factor at each said address of said look up table in accordance with said error signal for each said address.

8. A circuit as set forth in claim 7 wherein said apparatus for incrementally varying said correction factors includes an accumulator.

9. A circuit as set forth in claim 8, including a plurality of power amplifiers each, when on, providing an amplified carrier signal, and an modulation encoder for turning on selected ones of said power amplifiers as a function of the value of said amplitude varying signal.

10. A circuit as set forth in claim 8 including a power amplifier for amplifying said carrier signal and an audio modulator for varying the gain of said power amplifier as a function of the value of said amplitude varying signal.

11. A method for adaptively compensating for carrier signal phase distortion caused by amplitude modulating an RF carrier signal, comprising:
   receiving an RF carrier signal and modulating it by an amplitude varying signal to obtain therefrom a modulated RF carrier signal which is phase shifted from the phase of said carrier signal by an amount that varies with the value of said amplitude varying signal;
   phase shifting said RF carrier signal by a desired amount prior to said modulating in accordance with the value of a received phase correction signal to provide a pre-phase shifted carrier signal;
   comparing said modulated RF carrier signal and said carrier signal and providing an error signal in accordance with said comparison; and,
   adaptively varying said phase shifting by an amount depending on the value of said error signal and the value of said amplitude varying signal.

* * * * *